United States Patent [19]

Satou

[11] Patent Number: 5,061,552
[45] Date of Patent: Oct. 29, 1991

[54] MULTI-LAYER CERAMIC SUBSTRATE ASSEMBLY AND A PROCESS FOR MANUFACTURING SAME

[75] Inventor: Kazuaki Satou, Tokyo, Japan
[73] Assignee: Fujitsu Limited, Kawasaki, Japan
[21] Appl. No.: 469,788
[22] Filed: Jan. 24, 1990

[30] Foreign Application Priority Data

Jan. 24, 1989 [JP] Japan ................................. 1-013211

[51] Int. Cl.⁵ .................................................. B32B 9/00
[52] U.S. Cl. ...................................... 428/209; 428/210; 428/426; 428/432; 428/901; 156/89; 156/625
[58] Field of Search ............... 428/209, 210, 426, 432, 428/901; 156/89, 625

[56] References Cited

U.S. PATENT DOCUMENTS

| | | | |
|---|---|---|---|
| 3,268,653 | 8/1966 | McNutt | 174/68.5 |
| 3,568,312 | 3/1971 | Perricone | 29/625 |
| 3,576,722 | 4/1971 | Fennimore et al. | 204/15 |
| 3,742,597 | 7/1973 | Davis | 29/625 |
| 4,490,429 | 12/1984 | Tosaki et al. | 428/195 |

Primary Examiner—Patrick J. Ryan
Attorney, Agent, or Firm—Staas & Halsey

[57] ABSTRACT

A multi-layer ceramic substrate assembly comprising a multi-layer ceramic substrate including a via-conductor and an interconnecting line and having a surface, a first soldering pad on the surface of the substrate and electrically connected to the via-conductor, a second soldering pad on the surface of the substrate adjacent to the first soldering pad, a connecting pattern on the surface of the substrate for electrically connecting the first and second soldering pads, the connecting pattern being made of an electric conductor wettable with a solder, and a solder dam formed on the connecting pattern between the first and second soldering pads, the solder dam being made of a metal or a metal alloy or compound not wettable with a solder. The electric conductivity of the connecting pattern is carried by a metal having a good electric conductivity and the solder dam is made of a metal or a metal alloy or compound not wettable with a solder, whereby the solder dam stops a flow of a solder through the dam or under the dam. A simple and reliable process for forming such a solder dam is also provided.

18 Claims, 5 Drawing Sheets

TI-NI (GOOD)

SPUTTERED
CR (GOOD)

SPATTERED
CR
+
POLYIMIDE (GOOD)

AU ONLY (NO GOOD)

AU
+
POLYIMIDE (NO GOOD)

SPUTTERED NI (NO GOOD)

MULTI-LAYER CERAMIC SUBSTRATE ASSEMBLY AND A PROCESS FOR MANUFACTURING SAME

BACKGROUND OF THE INVENTION

1. Field of the Invention

The present invention relates to a multi-layer ceramic substrate assembly and a process for manufacturing the same.

2. Description of the Related Art

A multi-layer ceramic substrate assembly provided with pins to enable it to be used as a connector is known. The pins are mounted on pads on a surface of the substrate, the pads for the pins being connected to via-pads electrically connected to via-conductors in the substrate. Additional pads are connected to the pads for pins, for later modifications of the circuit. Such a multi-layer ceramic substrate assembly is illustrated in FIGS. 1-3. In these figures, 1 denotes a ceramic substrate body having via-conductors 2 and interconnecting lines 3, 4 denotes a via upper pad, 5 an upper insulating layer of polyimide, 6 a pin soldered to the via upper pad 4, and 7 a via lower pad. More specifically, the via upper pad 4 comprises a via pad 11, an I/O (in/out) pin pad 12, a modification pad 13, and connecting patterns 14 and 15.

The modification pads 13 are used when the circuit of the substrate is to be changed from the original circuit, by wiring between the modification pads 13 with a discrete wire, and if necessary, disconnecting the I/O pin pad 12 from the via upper pad 4. The wiring to the modification pad 13 is made by soldering a wire to the pad 13. To prevent a flow of a solder from the modification pad 13 to the I/O pin pad 12 during the reflow of the solder, a solder dam 16 is provided between the modification pad 13 and the I/O pad 12, the solder dam 16 being made of a resin such as polyimide (FIG. 3). The solder dam 16 mechanically prevents a flow of the solder 17, but cannot prevent a diffusion of the solder 17 under the resin solder dam 16, i.e., along the surface of the underlying gold plating layer 18, which is a common material used for the pads 11, 12 and 13 as well as the connecting patterns 14 and 15, because the gold plating layer is very easily wetted by the solder. If the solder flows from the modification pad 13 onto the I/O pin pad 12, the solder fixing the I/O pins is damaged and the fixing of the I/O pins is adversely affected, making the connector difficult to use. This adverse affect on the fixing of the pins must be prevented.

The object of the present invention is to provide a solder dam which prevents the flow of a solder between pads.

SUMMARY OF THE INVENTION

The above and other objects and feature of the present invention are attained by a multi-layer ceramic substrate assembly comprising a multi-layer ceramic substrate including a via-conductor and an interconnecting line therein and having a surface, a first soldering pad on the surface of the substrate and electrically connected to the via-conductor, a second soldering pad on the surface of the substrate adjacent to the first soldering pad, a connecting pattern on the surface of the substrate for electrically connecting the first and second soldering pads, the connecting pattern being made of an electric conductor wettable with a solder, and a solder dam on the connecting pattern between the first and second soldering pads, the solder dam being made of a metal or a metal alloy or compound not wettable with a solder.

In a preferred embodiment, a first solder having a first melting point is used for the first soldering pad to which a pin is fixed by the first solder, and a second solder having a second melting point lower than the first melting point is used for the second soldering pad.

The typical electric conductor for the connecting pattern includes copper, silver, gold, nickel, etc., and these metals, alloys or compounds may be used in combination, for example, in the form of a laminate.

The characteristic feature of the present invention is the solder dam made of a metal or metal alloy or compound not wettable with a solder, in combination with the connecting pattern made of an electric conductor metal. Typical of the materials used for the solder dam are a metal such as titanium, chromium, ruthenium, rhodium, molybdenum, tungsten, or a metal alloy or compound such as titanium-nickel.

A metal alloy or compound not wettable with a solder and formed from a reaction between a metal having a high electric conductivity and another metal, etc. is preferable, as this allows the former metal to be used as a top layer of the connecting pattern and the solder dam is formed by alloying or reacting the latter metal or other material formed on the connecting pattern with the former metal.

Thus, according to the present invention, there is also provided a process for manufacturing a multi-layer ceramic substrate assembly, comprising the steps of preparing a multi-layer ceramic substrate including a via-conductor and an interconnecting line and having a surface, forming a pattern of a first electric conductor metal on the surface of the substrate, said pattern including first, second and third portions, the first and second portions being connected by the third portion in said pattern, said first portion of said pattern being electrically connected with the via-conductor, said electric conductor metal being wettable with a solder, forming a first soldering pad of a second electric conductor metal on the first portion of said pattern, forming a second soldering pad of a third electric conductor metal on the second portion of said pattern, entirely covering said first electric conductor metal pattern with a metal, reacting said metal selectively with the first electric conductor metal at the third portion of said pattern to form a metal alloy or compound at that point, and selectively etching said metal remaining at least on the first and second portions but not said metal alloy or compound, wherein said first and second soldering pads are wettable with a solder and said metal alloy or compound is not wettable with a solder.

In a preferred embodiment, a pin is fixed on the first portion of the above pattern with a solder having a relatively high melting point. The second portion of the pattern is used for modification of the circuit in the multi-layer ceramic substrate assembly.

Also, in a preferred embodiment, the pattern of the first electric conductor metal is made of a combination of a copper lower layer and a nickel top layer formed on the copper lower layer, the first and second soldering pads are made of gold, and the metal for covering the pattern of the first electric conductor metal is titanium; a metal alloy or compound formed from a reaction between the nickel and titanium being an intermetallic compound of titanium-nickel.

DESCRIPTION OF THE PREFERRED EMBODIMENTS

Figure 2:
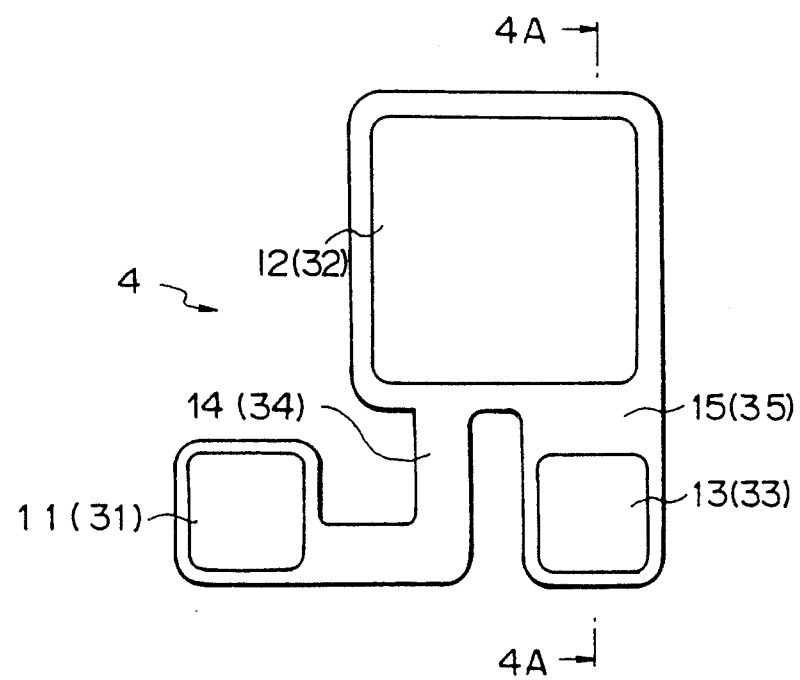
Figure 3:
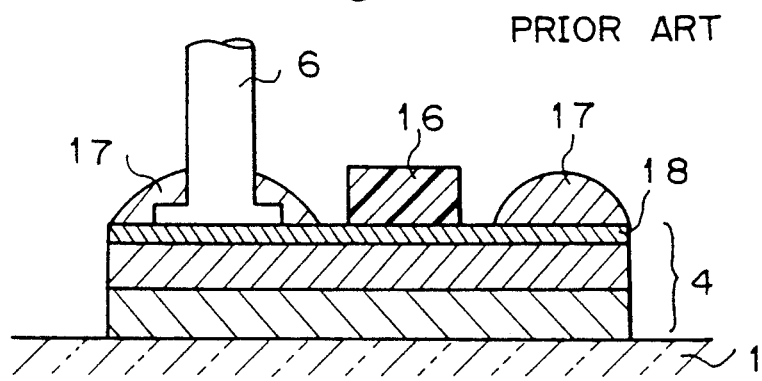

FIG. 2 is a plan view of an upper via pad of a multi-layer ceramic substrate assembly, on which an I/O pin is to be fixed. This upper via pad includes a via pad 31, an I/O pin pad 32, a modification pad 33, a connecting pattern 34 between the via pad 31 and the I/O pin pad 32, and a connecting pattern 35 between the I/O pin pad 32 and modification pad 33. The via pad 31 is electrically connected to a via-conductor in the multi-ceramic substrate.

Figure 1:
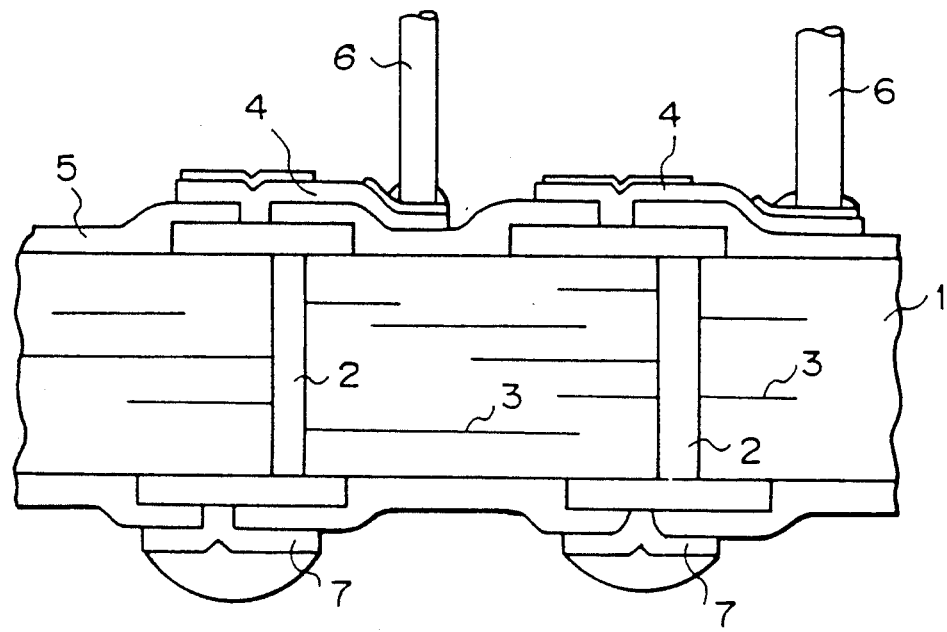
FIGS. 1–3 illustrate a typical multi-layer ceramic substrate assembly, in which FIG. 3 relates to a prior art.
Figure 4:
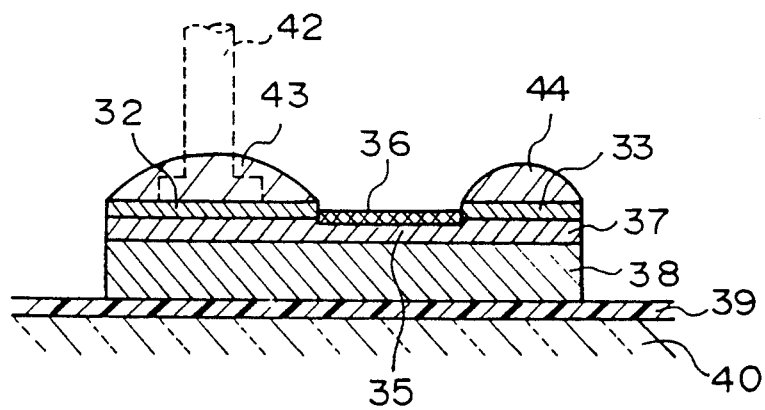
FIGS. 4 and 5 are cross-sectional views of an upper via pad of a multi-layer ceramic substrate according to the present invention after and during manufacture.

FIG. 4 is a sectional view of the upper via pad of FIG. 2 along the line 4A-4A cutting the I/O pin pad 32, the modification pad 33 and the connecting pattern 35. The not shown section of the upper pad cutting from the via pad 31 to the connecting pattern 34 to the I/O pin pad 32 is basically similar to FIG. 5, although the via pad 31 is connected to a via-conductor in the substrate as shown in FIG. 1. In FIG. 4, the I/O pin pad 32 and the modification pad 33 are made of a gold, respectively, 36 denotes a solder dam made of a titanium-nickel intermetallic compound, 37 denotes a top conductor layer made of nickel, 38 denotes a body conductor layer made of copper, 39 denotes an insulating layer made of polyimide, and 40 denotes a multi-layer ceramic layer.

In FIGS. 2 and 4, the I/O pin and modification pads 32 and 33 of gold are each a good electric conductor and easily wettable with a solder, and the solder dam 36 of titanium-nickel is not wettable with a solder. The conductor layers 37 and 38 of nickel and copper are each a good electric conductor. The nickel conductor layer 37 is inserted as a barrier between the copper conductor layer 38 and the gold pads 32 and 33, and although still a good conductor is inferior to copper in the electric conductivity thereof. The nickel layer 37 is wettable with a solder, and therefore, requires a good solder dam. In the prior art, an organic layer of polyimide is used as the solder dam, but the solder flows along the interface between the polyimide and the nickel layer because the solder has a good wettability with the nickel. To avoid this flow of a solder under the polyimide, a metal not wettable with a solder was proposed for use as a connecting pattern, per se, with an organic solder dam thereon, but this disadvantageously lowered the electric conductivity of the connecting pattern between the pads. In contrast, according to the present invention, a metal or a metal alloy or compound such as a titanium-nickel intermetallic compound is used as a solder dam on a connecting pattern of a good electric conductor metal such as copper or nickel, and the adhesion of the metal or metal alloy or compound solder dam to the metal connecting pattern is strong enough to prevent a flow of a solder therebetween.

Figure 5:
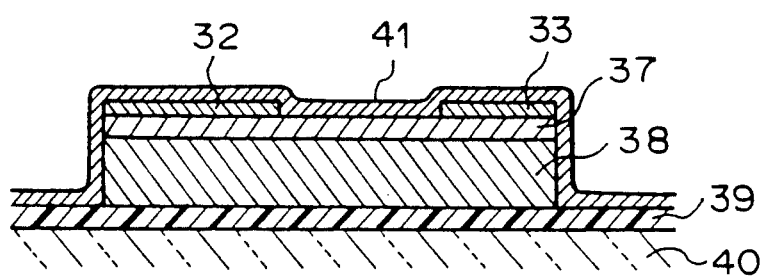

In a preferred embodiment, the above upper via pad is manufactured as follows. FIG. 5 shows a step of manufacturing the upper via pad of FIGS. 2 and 4. A multi-layer ceramic substrate 40 (e.g., thickness 12 mm) is prepared in a conventional way. After the polyimide insulating layer 39 (e.g., thickness 20 $\mu$m) is formed on the multi-layer ceramic substrate 40, the copper body conductor layer 38 (e.g., thickness 4 $\mu$m) and the top conductor layer 37 (e.g., thickness 2 $\mu$m) are sputtered thereon to form upper via pad including the three pads 31–33 and the two connecting patterns 34–35. Then three gold pads 31–33 (e.g., thickness 0.5–1 $\mu$m) are formed on the nickel top conductor layer 37 (the plan view shown in FIG. 2) by plating and selectively etching the gold plating layer on the connecting patterns 34 and 35.

Then a titanium layer 41 (e.g., thickness 100 nm) is deposited entirely over the gold pads 31–33, the nickel connecting patterns 34–35, and the polyimide layer 39. This is followed by a heat treatment at 500° C. for 60–90 minutes, by which the gold pads 31–33 are not changed and the nickel top conductor layer 37 at the connecting patterns 33–34 selectively reacts with the titanium to form a titanium-nickel intermetallic compound, $Ti_2-N_3$. This titanium-nickel intermetallic compound forms a solder dam 36 covering the nickel top conductor layer 37 at the connecting patterns 33–34.

Then the ceramic substrate is immersed in a hydrogen fluoride solvent (about 1% conc.). During this immersion, the titanium-nickel intermetallic compound on the connecting patterns 33–34 is not dissolved but remains, and the titanium layer 41 over the pads 31–33 and the polyimide layer 39 is selectively dissolved. Thereafter, the upper via pad as shown in FIG. 4 is obtained. As mentioned before, the gold pads 31–33 are wettable with a solder but the titanium-nickel intermetallic compound connecting patterns 33–34 are not wettable with a solder, and thus form or function as a solder dam. Accordingly, a solder dam is easily formed on the connecting patterns.

Moreover, this preferred process of forming the solder dam does not require a photolithography step, because the solder dam of the titanium-nickel intermetallic compound is selectively formed at the connecting patterns by the heat treatment, and the titanium-nickel intermetallic compound acts as a mask in the following etching step, and therefore, the process is simple. In contrast, in the prior art, the formation of a solder dam of a polyimide or the like requires such a photolithography step.

After formation of the upper via pads, as above, I/O pins 42 are soldered to the I/O pin pads 32 with a solder 43 having a relatively high melting point, such as gold-tin (about 350° C.). Then, a solder 44 having a relatively low melting point such as tin (about 250° C.) is bonded on the modification pad 33 for later use. The soldering is carried out by preliminary bonding the solders 43 and 44 to the pads, setting and fixing the I/O pins 42 to the I/O pin pads 32, and carrying out a reflow heat treatment in an oven (at about 350° C.), whereby a multi-layer ceramic substrate assembly or connector is produced.

When the original circuit of the assembly is to be changed, discrete wires are used to connect between desired I/O pins and/or via conductors, and the disconnection of the I/O pins from via conductors is made by cutting the connecting pattern between the I/O pin pad and the via pad, usually by a laser. The wires are bonded to desired modification pads with the solder. This soldering can be conducted at a relatively low temperature (about 250° C.) at which the solder fixing the I/O pins to the I/O pin pads 32 is not damaged, because the solder fixing the I/O pins has a relatively high melting point (about 350° C.). Note, during this heat treatment for soldering the wire to the modification pad, the solder cannot flow to the I/O pin pad 32 because of the presence of the solder dam 36.

It should be noted that the present invention is not limited to the above preferred process of forming the solder dam, and is applicable to any solder dam made of a metal or a metal alloy or compound not wettable with a solder in combination with another metal connecting pattern having a good electric conductivity.

EXAMPLES

Figure 6:
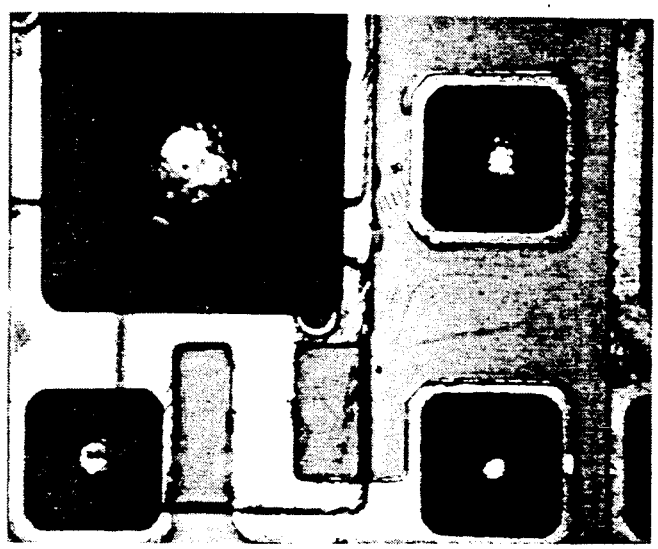
FIGS. 6–11 are photographs of the upper via pad having various solder dams, after a heat treatment.
Figure 7:
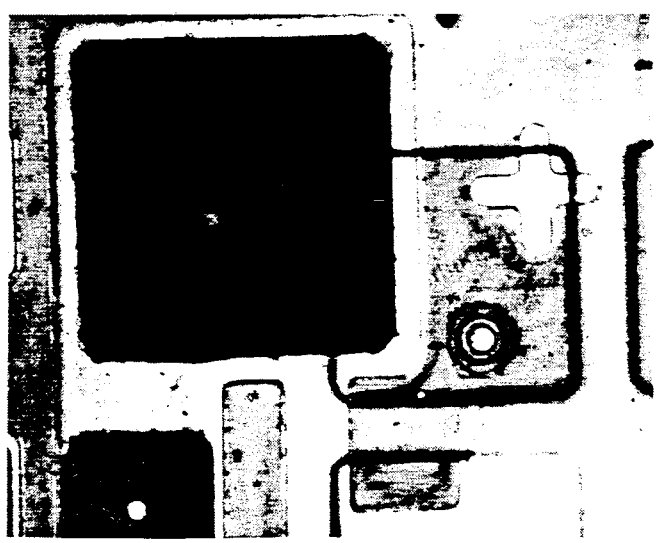
Figure 8:
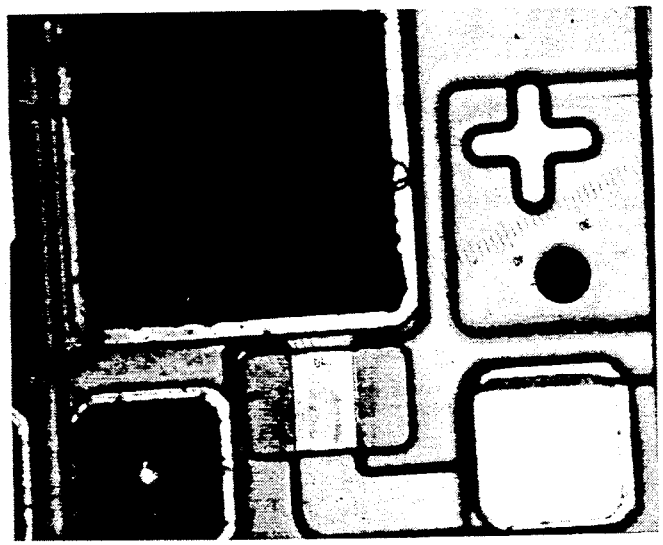
Figure 9:
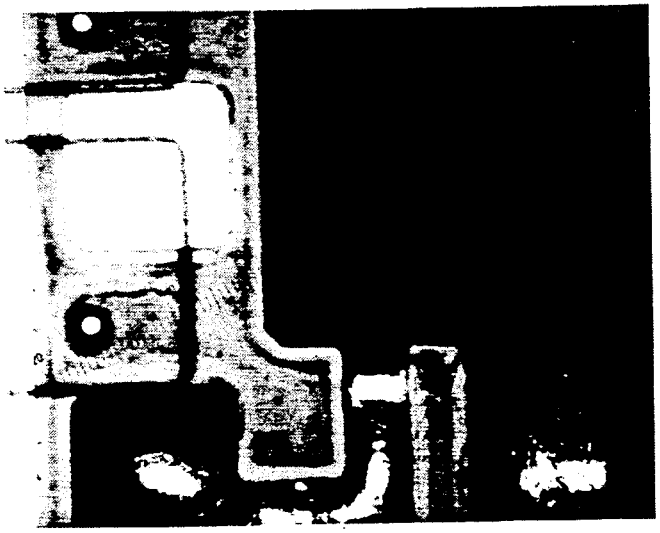
Figure 10:
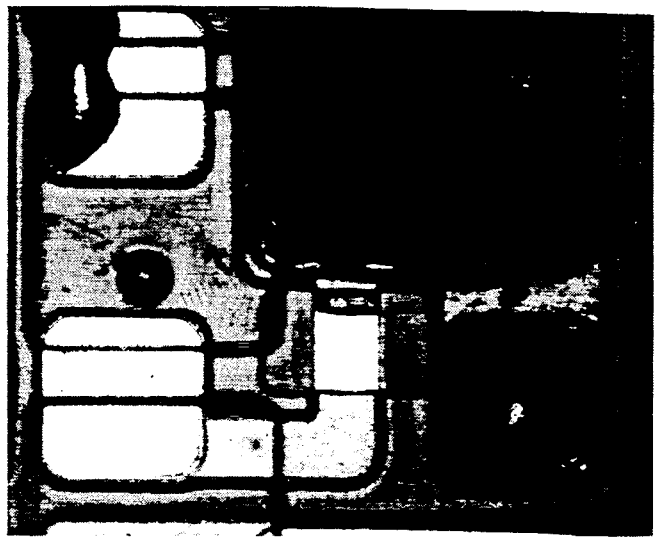
Figure 11:
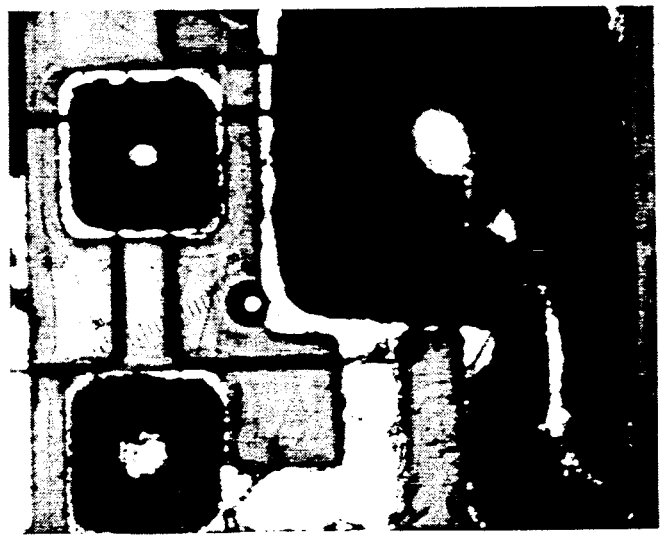

Solder dams were formed from various materials, and the flow of the solder through the solder dam was examined. FIGS. 6-11 show the results after a heat treatment at 350° C. for 3 minutes. The photographs were taken at a magnification of 50. In FIGS. 6-8, the upper pad is an I/O pin pad, the lower left pad is a via pad, the lower right pad is a modification pad, and the connecting patterns can be seen between the pads. FIGS. 9-11 are symmetrical to FIGS. 6-8 at the left and right sides thereof.

FIG. 6 shows the results obtained with a solder dam formed of the titanium-nickel intermetallic compound made as described above; the results are good in that no solder flows onto or through the solder dam.

FIG. 7 shows the results obtained with a solder dam of sputtered chromium. The results are good in that no solder flows onto or through the solder dam.

FIG. 8 shows the results obtained with a solder dam of sputtered chromium with a coat of polyimide thereon. The results are good in that no solder flows onto or through the solder dams.

FIG. 9 shows the results obtained with a solder dam of plated gold. The results are not good in that solder flows onto and through the connecting patterns. The black at the connecting patterns indicates the flowed solder; the partially seen white is due to light reflection when taking the photo.

FIG. 10 shows the results obtained with a solder dam of polyimide over plated gold connecting patterns. The results are not good in that solder flows partially under the left hand solder dam and onto the right hand solder dam; the right hand connecting pattern having a dark color in comparison with the whiteness of FIGS. 6-8, indicating a flow of solder in the lower layer.

FIG. 11 shows the results obtained with a solder dam of sputtered nickel. The results are not good in that solder flows onto and through the right hand solder dam, and a similar solder flow will occur at the left hand solder dam.

I claim:

1. A multi-layer ceramic substrate assembly comprising:
   a multi-layer ceramic substrate including a via-conductor and having a surface;
   a first soldering pad on the surface of said substrate, said first soldering pad having an outermost surface of a metal wettable with a solder;
   a second soldering pad on the surface of said substrate remote from said first soldering pad, said second soldering pad having an outermost surface of a metal wettable with a solder;
   a connecting pattern on the surface of said substrate, said connecting pattern electrically connecting said first and second soldering pads, said connecting pattern having an outermost surface; and
   a solder dam on a portion of the outermost surface of said connecting pattern, said solder dam being made of a material not wettable with a solder.

2. An assembly according to claim 1, wherein said first and second soldering pads are made of one of the group consisting of gold, silver, and nickel.

3. An assembly according to claim 1, wherein said solder dam is made of one of the group consisting of titanium, chromium, ruthenium, rhodium, molybdenum, tungsten, and titanium-nickel.

4. An assembly according to claim 3, wherein said solder dam is titanium-nickel intermetallic compound.

5. An assembly according to claim 1, further comprising a first solder having a first melting point on said first soldering pad and a second solder having a second melting point lower than the first melting point on said second soldering pad.

6. An assembly according to claim 5, wherein said first solder is gold-tin and said second solder is tin.

7. An assembly according to claim 5, further comprising a pin soldered to said first soldering pad by said first solder such that said pin stands erect on the outermost surface of said first soldering pad.

8. An assembly according to claim 1, wherein said second soldering pad is used for modification of an electric circuit in the multi-layer ceramic substrate assembly.

9. An assembly according to claim 1, wherein the outermost surface of said connecting pattern includes an electrically interrupted portion, and wherein said solder dam is formed on the electrically interrupted portion of said connecting pattern.

10. A process for manufacturing a multi-layer ceramic substrate assembly, comprising the steps of:
    forming a first electric conductor metal pattern on a surface of a multi-layer ceramic substrate having a via-conductor, said pattern including first, second and third portions, the first and second portions being electrically connected by the third portion in said pattern, the first portion of said pattern being electrically connected with said via-conductor, said first electric conductor metal pattern having an outermost surface;
    forming a first soldering pad of a second electric conductor metal on the first portion of the outermost surface of said pattern, said first soldering pad including an outermost surface wettable with a solder;
    forming a second soldering pad of a third electric conductor metal on the second portion of the outermost surface of said pattern, said second soldering pad including an outermost surface wettable with a solder;
    depositing a reactive metal over the entire exposed outermost surface of said pattern, said first soldering pad and said second soldering pad;
    forming a solder dam by reacting said reactive metal selectively with said first electric conductor metal at the third portion of the outermost surface of said pattern to form a material not wettable with a solder; and
    selectively etching said metal remaining at least on said first and second soldering pads, wherein said first and second soldering pads are wettable with a solder and said solder dam is not wettable with a solder.

11. A process according to claim 8, wherein said second and third conductor metals are one of the group consisting of gold and alloys thereof, said first conductor metal pattern is nickel, said reactive metal is titanium, and said solder dam is a titanium-nickel intermetallic compound.

12. A process according to claim 8, further comprising the step of bonding a first solder having a first melting point on the outermost surface of said first soldering pad and a second solder having a second melting point lower than the first melting point on the outermost surface of said second soldering pad.

13. A process according to claim 12, wherein said first solder is gold-tin and said second solder is tin.

14. A process according to claim 10, further comprising the step of soldering a pin to said first soldering pad by said first solder such that said pin stands erect on the outermost surface of said first soldering pad.

15. A process according to claim 10, wherein said second soldering pad is used for modification of an electric circuit in the multi-layer ceramic substrate assembly.

16. A process according to claim 8, further comprising the step of forming a body conductor copper layer on the multi-layer ceramic layer, and wherein said pattern is nickel formed on said body conductor copper layer.

17. A process according to claim 10, further comprising the step of forming an insulating layer on the surface of the multi-layer ceramic layer.

18. A process according to claim 8, wherein said step of forming said solder dam includes the substep of forming an electrically interrupted portion on the outermost portion of said pattern.

* * * * *